US007455529B2

(12) United States Patent
Fujii et al.

(10) Patent No.: US 7,455,529 B2
(45) Date of Patent: Nov. 25, 2008

(54) WIRING BOARD, INPUT DEVICE USING THE SAME WIRING BOARD AND METHOD OF MANUFACTURING THE SAME INPUT DEVICE

(75) Inventors: Shoji Fujii, Osaka (JP); Koji Tanabe, Osaka (JP); Yousuke Chikahisa, Hyogo (JP)

(73) Assignee: Panasonic Corporation (JP)

(*) Notice: Subject to any disclaimer, the term of this patent is extended or adjusted under 35 U.S.C. 154(b) by 362 days.

(21) Appl. No.: 11/378,462

(22) Filed: Mar. 17, 2006

(65) Prior Publication Data

US 2006/0223346 A1 Oct. 5, 2006

(30) Foreign Application Priority Data

Mar. 31, 2005 (JP) ............................ 2005-102173

(51) Int. Cl.
*H01R 12/00* (2006.01)

(52) U.S. Cl. ........................................................ 439/67

(58) Field of Classification Search ................... 439/67, 439/77; 361/749; 174/254; 349/150; 345/173
See application file for complete search history.

(56) References Cited

U.S. PATENT DOCUMENTS

| | | | | |
|---|---|---|---|---|
| 3,633,189 | A * | 1/1972 | Billawala | 360/245.8 |
| 3,805,213 | A * | 4/1974 | Austin | 439/77 |
| 4,561,709 | A * | 12/1985 | Fukukura | 439/77 |
| 5,001,308 | A * | 3/1991 | Mori | 200/5 A |
| 5,779,498 | A * | 7/1998 | Asakawa | 439/495 |
| 6,304,251 | B1 * | 10/2001 | Ito et al. | 345/173 |
| 7,108,515 | B2 * | 9/2006 | Tanabe et al. | 439/67 |
| 7,227,537 | B2 * | 6/2007 | Nakayama et al. | 345/173 |

FOREIGN PATENT DOCUMENTS

JP 2003-108302 A 4/2003

* cited by examiner

*Primary Examiner*—Neil Abrams
(74) *Attorney, Agent, or Firm*—RatnerPrestia

(57) ABSTRACT

A wiring board used for various electronic apparatuses, an input device such as an optically transparent touch panel using the wiring board, and a method of manufacturing the input device. A plurality of electrodes provided at the side of one end of one principal surface of wiring board, wiring patterns coupled to electrodes, and a connector disposed region provided at the side of the other end of wiring board are provided. In this connector disposed region, connectors are disposed. In substantially the central portion of the connector disposed region, a concave portion is provided and in the vicinity of connectors, a bending portion is disposed. Furthermore, a cut portion is disposed between or in the vicinity of the plurality of connectors. The wiring board may thereby be manufactured with all conductive portions on one side and then, by bending. some connectors maybe be positioned on the other side.

12 Claims, 7 Drawing Sheets

WIRING BOARD, INPUT DEVICE USING THE SAME WIRING BOARD AND METHOD OF MANUFACTURING THE SAME INPUT DEVICE

TECHNICAL FIELD

The present invention relates to a wiring board used for various electronic apparatuses, an input device such as an optically transparent touch panel using the wiring board, and a method of manufacturing the input device.

BACKGROUND ART

In recent years, electronic apparatuses have been sophisticated and diversified. The tread is accompanied by an increase of electronic apparatuses in which an input device such as an optically transparent touch panel is mounted on the front surface side of a display device such as a liquid crystal display (LCD) and via this input device, a user recognizes and selects texts, marks, symbols or the like displayed on the display device, thereby switching functions of the electronic apparatus.

Such a conventional input device is described hereinafter with reference to FIG. 7 to FIG. 9 on an optically transparent touch panel (hereinafter referred to as touch panel) as an example.

FIG. 7 is an exploded perspective view showing a conventional touch panel. Touch panel 700 includes optically transparent upper substrate 81 made from polyethylene terephthalate, polycarbonate film, or the like. Upper substrate 81 has, for example, a rectangular shape. On substantially the entire surface of one principal surface of upper substrate 81, upper conductive layer 82 made from indium tin oxide, tin oxide, or the like, is formed by, for example, vacuum spattering.

A pair of upper electrodes 83 and 84 formed by printing paste such as silver or carbon are disposed, for example, along the outer circumferences of short side 81S and long side 81L of upper substrate 81. Upper electrodes 83 and 84 are formed by using silver or carbon in a portion in which a part of upper conductive layer 82 has removed by etching or laser-cutting. Upper electrodes 83 and 84 at one end are disposed on boundary portion 81LS of long side 81L and short side 81S of upper substrate 81, extend therefrom to central portion 81LC of long side 81L and coupled to upper lead parts 83A and 84A at another end, respectively. In the vicinity of upper lead parts 83A and 84A, dummy lead parts 83B and 84B are disposed.

Furthermore, optically transparent lower substrate 85 made from acrylic resin, poly-carbonate resin, or the like, is disposed facing upper substrate 81 and includes optically transparent lower conductive layer 86 on substantially the entire surface of one principal surface of lower substrate 85, similar to upper conductive layer 82.

A pair of lower electrodes 87 and 88 are formed by using silver or carbon in a portion from which a part of lower conductive layer 86 has removed by etching or laser-cutting. One ends of lower electrodes 87 and 88 extend to substantially central part 86LC of long side 86L of lower substrate 85, and are coupled to lower lead parts 87A and 88A, respectively. In the vicinity of lower lead parts 87A and 88A, dummy lead parts 87B and 88B are disposed.

Lower conductive layer 86 has a plurality of dot-spacers (not shown) on its one principal surface for maintaining predetermined space between upper conductive layer 82 and lower conductive layer 86. The dot spacers are formed at predetermined intervals and made from insulating resin such as epoxy or silicon.

Furthermore, frame-like spacer 89 having adhesive applied to its upper and lower surfaces is provided on one principal surfaces of upper and lower substrates 81 and 85. Upper conductive layer 82 and lower conductive layer 86 are bonded at their outer circumferences with spacer 89 so that upper conductive layer 82 and lower conductive layer 86 face each other with predetermined space maintained therebetween. Between upper substrate 81 and lower substrate 85, flexible wiring board 10 is inserted to be held. Flexible wiring board 10 includes a plurality of wiring patterns, electrodes and connectors formed on both surfaces of the substrate as described below.

FIG. 8 is an enlarged view showing wiring board 10 shown in FIG. 7. At the side of one end 10R of one principal surface of wiring board 10, a plurality of electrodes 12B to 15B are disposed at substantially the same intervals. Electrodes 12B to 15B are coupled to one ends of wiring patterns 12 to 15, respectively. Connectors 12A to 15A are coupled to the other ends of wiring patterns 12 to 15. With such a configuration, electrodes 12B to 15B and connectors 12A to 15A are located at the most distant places from each other on wiring board 10.

Wiring patterns 12 and 14 extending from electrodes 12B and 14B extend on one principal surface of wiring board 10 and are directly coupled to connectors 12A and 14A, respectively. On the other hand, wiring patterns 13 and 15 extending from electrodes 13B and 15B pass through through-holes 13C and 15C, which are formed by filling a conductive agent to holes piercing from one principal surface toward the other principal surface of wiring substrate 10, are coupled to wiring patterns 13D and 15D of the lower surface disposed on the other principal surface, and then extends to be coupled to connectors 13A and 15A provided on the other principal surface.

FIG. 9 is a sectional view showing conventional touch panel 700 shown in FIG. 7. On one principal surface of upper substrate 81, anisotropic conductive adhesive agent 11 is applied between lead parts of upper electrodes 83 and 84, and connectors of wiring board 10, and upper lead parts 83A and 84A of upper substrate 81 are coupled to connectors 12A and 14A on the upper surface and, lower lead parts 87A and 88A of lower substrate 85 are coupled to connectors 13A and 15A on the lower surface, respectively. Thus, touch panel 700 is constructed.

Note here that on upper substrate 81 and lower substrate 85, dummy lead parts 83B, 84B, 87B and 88B are disposed. Such dummy lead parts are provided in order to equalize the thickness between upper substrate 81 and lower substrate 85 when wiring board 10 is inserted to be held between upper substrate 81 and lower substrate 85, and the predetermined lead part and the connector are coupled to each other by heating and pressing treatment. Thus, both substrates can be pressed uniformly. Touch panel 700 is mounted on a front surface of a display device such as an LCD. Electrodes 12B to 15B provided at one end 10R of wiring board 10 are coupled to a detecting circuit of an electronic apparatus by coupling connectors (not shown) and the like.

When upper substrate 81 that is an operation surface of touch panel 700 is depressed by a finger, a pen, or the like, upper substrate 81 is bowed and upper conductive layer 82 corresponding to the depressed portion of upper substrate 81 is brought into contact with lower conductive layer 86. Then, the detecting circuit (not shown) applies voltage to a portion between upper electrodes 83 and 84 via connectors 12A and 14A as well as a portion between lower electrodes 87 and 88 via connectors 13A and 15A, respectively. From the applied voltage and electric current, a resistance component between each upper electrode and lower electrode is calculated. From the ratio of the resistance components of those electrodes, the depressed position is detected, thereby switching a function of the electronic apparatus to another function.

Resistance component Rx at the side of the upper electrode is detected at connectors 12A and 14A and resistance component Ry at the side of the lower electrode is detected at connectors 13A and 15A, respectively. The size of resistance component Rx and the size of resistance component Ry are sent to a detecting circuit, respectively, by electrodes 12B and 14B and electrodes 13B and 15B disposed on one end portion 10R of wiring board 10.

Information on prior art document relating to the invention of this application is disclosed in, for example, Japanese Patent Unexamined Publication No. 2003-108302.

However, in the above-mentioned conventional wiring board and the input device using the same, in the resistance components of the upper and lower electrodes, resistance component Rx at the side of the upper electrode on the upper surface is detected at connectors 12A and 14A on the upper surface and sent to a detecting circuit by electrodes 12B and 14B by way of wiring patterns 12 and 14 which extend as it is.

On the other hand, resistance component Ry at the side of the lower electrode on the lower surface is detected at connectors 13A and 15A on the lower surface and sent to a detecting circuit by electrodes 13B and 15B by way of wiring patterns 13 and 15 extending from wiring patterns 13D and 15D on the lower surface and changing the place to the upper surface through through-holes 13C and 15C.

In a conventional wiring board and touch panel, it is necessary to couple the connector of wiring board 10 corresponding to the place between the upper electrode and the lower electrode which face each other. Therefore, wiring board 10 has to be provided with wiring patterns both on one principal surface and the other principal surface of wiring board 10 and through holes. Consequently, there was a problem that a manufacturing process is increased, which makes an input device expensive.

SUMMARY OF THE INVENTION

A wiring board of the present invention includes first and second electrodes provided on one principal surface of the wiring board, first and second connection patterns coupled respectively to the first and second electrodes at one end, first and second connectors coupled to an other end of the first and second connection patterns, a connector disposed region in which the first and second connectors are disposed, a concave portion provided in the connector disposed region and having no member of the wiring board therein; and a bending portion disposed between the connector disposed region and at least one connector of the first and second connectors.

Furthermore, the wiring board of the present invention includes a cut portion being disposed between the first connector and the second connector. Furthermore, the cut portion communicates to at least a part of the bending portion. Furthermore, the bending portion is disposed in parallel to or perpendicular to a longitudinal direction of the wiring board. Furthermore, the concave portion is disposed in substantially a central portion of the connector disposed region, or disposed between at least one of the plurality of connectors and at least one of other connectors. Furthermore, when at least one of the plurality of connectors is bent from substantially the central portion of the connector disposed region to the outside direction without providing a concave portion, a concave portion may appear in the place where the connector has been bent. Furthermore, when any one of the first connector and the second connector is bent along the bending portion, the bent connector is contained in the concave portion. Furthermore, a part of the bending portion communicates to an indentation provided on a part of the wiring board. Furthermore, when any one of the first connector and the second connector is bent along the bending portion, a line linking between the first and second connectors is disposed on the same line that is perpendicular to a longitudinal direction of the wiring board.

An input device of another aspect of the present invention includes a wiring board including. The input device further includes an upper substrate including an upper conductive layer provided on an entire surface or a part of one principal surface and an upper electrode coupled to the upper conductive layer; and a lower substrate including a lower conductive layer, provided on an entire surface or a part of one principal surface, facing the upper conductive layer with predetermined space between the upper and lower conductive layers and a lower electrode coupled to this lower conductive layer. The first and second connectors of the wiring board are coupled to the upper electrode of the upper substrate and the lower electrode of the lower substrate. When the first connector is coupled to the upper electrode of the upper substrate, the second connector is coupled to the upper electrode on the upper substrate. That is to say, the first or second connector of the wiring board is coupled to any one of the upper electrode of the upper substrate and the lower electrode of the lower substrate.

Furthermore, a method of manufacturing an input device includes bending a wiring board along a bending portion and then coupling the first and second connectors to a predetermined portion of the upper electrode and the lower electrode of the upper and lower substrates which are facing each other.

In accordance with the above-mentioned configuration, wiring patterns on both surfaces of wiring board and through-holes are not needed in order to change the arrangement surface of connectors, which makes it possible to achieve inexpensive wiring board.

Furthermore, since wiring patterns on both surfaces of a wiring board and through-holes are not needed, it is possible to provide inexpensive input devices.

Furthermore, in the method of manufacturing an input device, after a wiring board is bent along a bending portion, a plurality of connectors of this wiring board are coupled to a predetermined positions of the upper and lower electrodes. Thus, inexpensive input device can be provided.

DETAILED DESCRIPTION OF THE INVENTION

Figure 1:
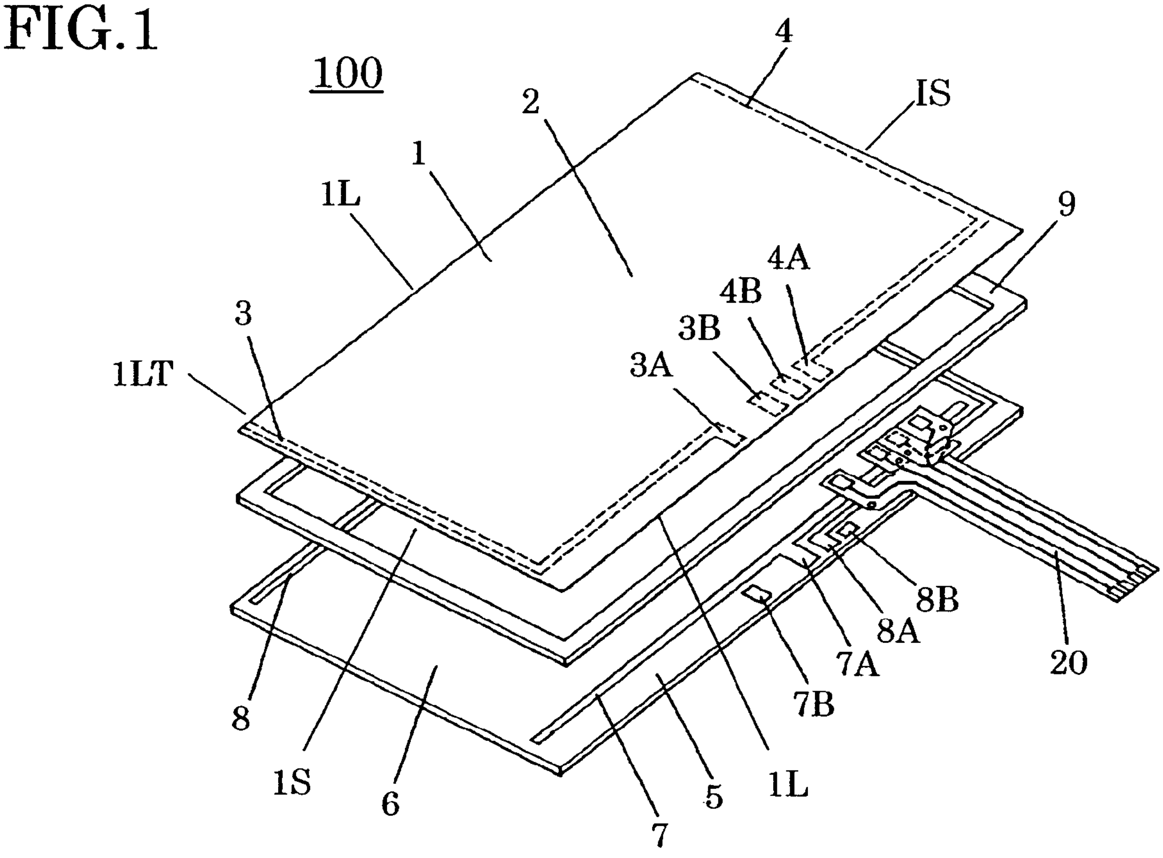
FIG. 1 is an exploded perspective view showing a touch panel in accordance with an embodiment of the present invention.

Embodiments of the present invention are described with reference to FIGS. 1 to 6 mainly on a touch panel as an example.

The same reference numerals are given to portions having the same configuration as that described in "Background Art."

First Embodiment

FIG. 1 is an exploded perspective view showing a touch panel in accordance with a first embodiment of the present invention. Touch panel 100 includes optically transparent upper substrate 1 made from polyethylene-terephtalate, polycarbonate film, or the like. Optically transparent upper conductive layer 2 made of indium tin oxide, tin oxide, or the like, is formed on substantially the entire surface of one principal surface of upper substrate 1 by, for example, a vacuum sputtering method.

Upper electrodes 3 and 4 are disposed in a portion in which a part of upper conductive layer 2 is removed by etching or laser-cutting. A pair of upper lead parts 3A and 4A are coupled to the ends of upper electrodes 3 and 4, respectively. In the vicinity of upper lead parts 3A and 4A, dummy lead parts 3B and 4B are disposed.

Lower substrate 5 made from glass, acrylic resin, polycarbonate resin, or the like, is optically transparent like upper substrate 1. Optically transparent lower conductive layer 6 is formed on substantially the entire surface of one principal surface of lower substrate 5, similar to upper conductive layer 2.

Lower electrodes 7 and 8 are disposed in a portion in which a part of lower conductive layer 6 is removed by etching or laser-cutting. A pair of lower lead parts 7A and 8A are coupled to the ends of lower electrodes 7 and 8, respectively. In the vicinity of lower lead parts 7A and 8A, dummy lead parts 7B and 8B are disposed.

Lower conductive layer 6 has a plurality of dot-spacers (not shown) on its upper surface for maintaining predetermined space between upper conductive layer 2 and lower conductive layer 6. The dot spacers are formed at predetermined intervals and made from insulating resin such as epoxy or silicon. Upper and lower substrates 1 and 5 are bonded at their outer circumferences by frame-like spacer 9 having adhesive applied to the upper and lower surfaces thereof so that upper and lower conductive layers 2 and 6 face each other with predetermined space therebetween.

Note here that dummy lead parts 3B, 4B, 7B and 8B provided on upper substrate 1 and lower substrate 5 are provided in order to maintain the thickness between upper substrate 1 and lower substrate 5 to be substantially the same over the entire surface when wiring board 20 is inserted to be held between upper substrate 1 and lower substrate 5 and then heating and pressing treatment is carried out. It is not preferable that without dummy lead parts 3B, 4B, 7B and 8B, convex and concave portions are generated on the entire touch panel 100 and the thickness of touch panel 100 may become ununiform.

Figure 2A:
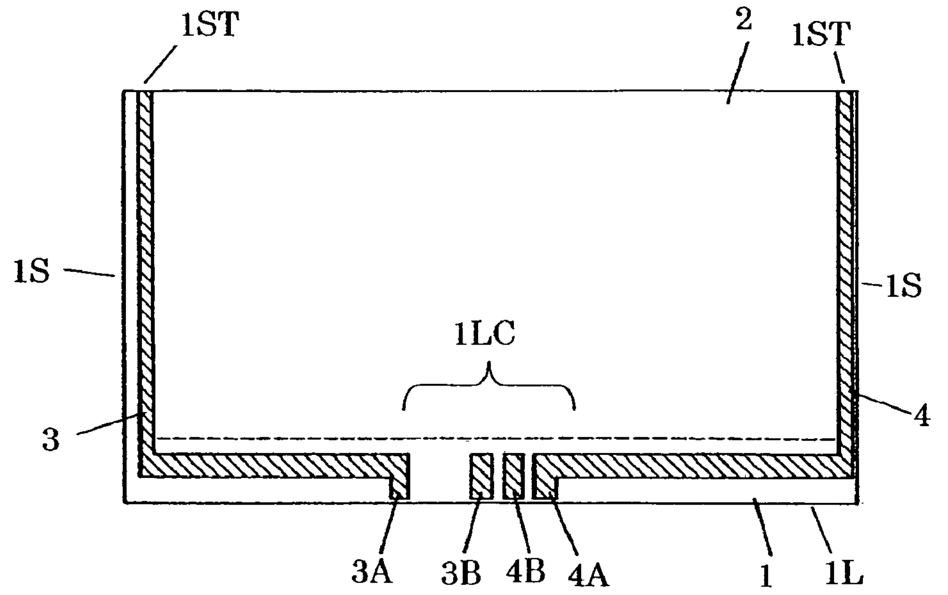
FIG. 2A is a plan view showing an upper substrate of the touch panel shown in FIG. 1.

FIG. 2A is a view showing only upper substrate 1 shown in FIG. 1. Upper conductive layer 2 is formed on substantially the entire surface of one principal surface of upper substrate 1. Furthermore, on the one principal surface of upper substrate 1, a pair of upper electrodes 3 and 4 are disposed. Upper electrodes 3 and 4 are formed by removing a part of upper conductive layer 2 through etching or laser-cutting and then by printing paste such as silver or carbon in the removed portion. Upper electrodes 3 and 4 are formed in substantially L-shape extending from each end 1ST of short side 1S of upper substrate 1 to substantially central part 1LC of long side 1L. Ends of upper electrodes 3 and 4A are coupled to a pair of upper lead parts 3A and 4A, respectively. In the vicinity of upper lead parts 3A and 4A, dummy lead parts 3B and 4B are disposed.

Figure 2B:
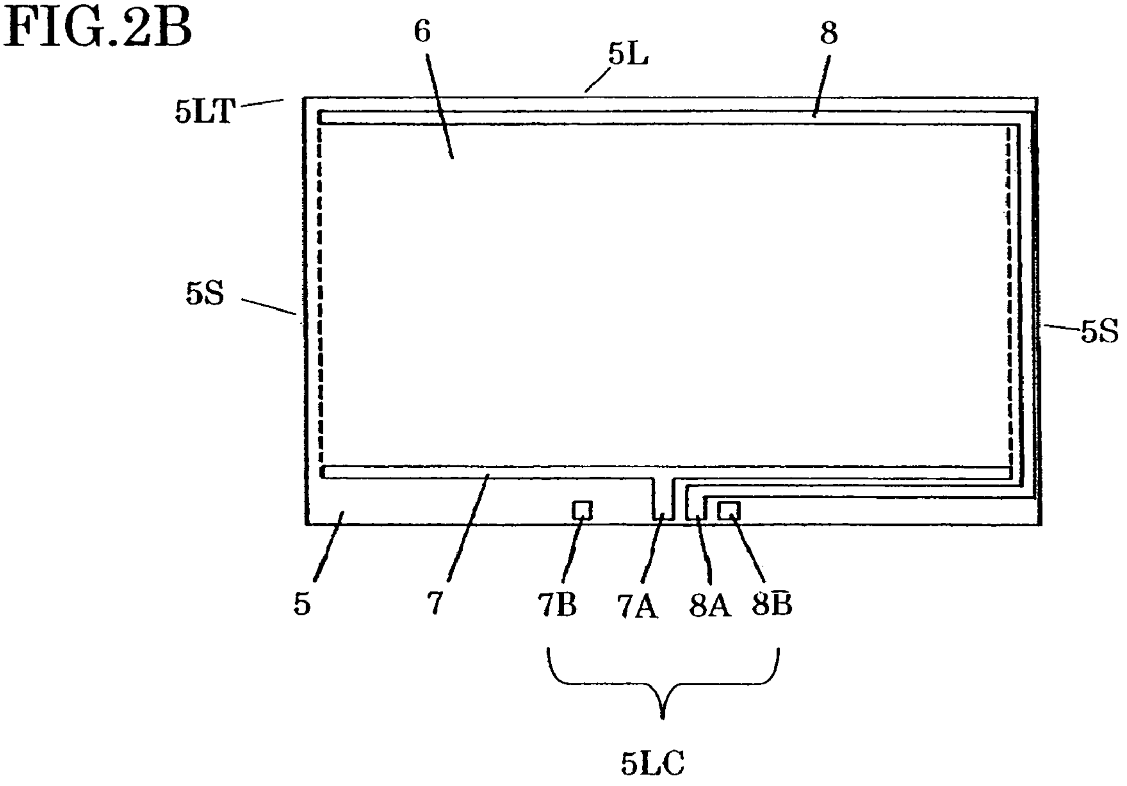
FIG. 2B is a plan view showing a lower substrate of the touch panel shown in FIG. 1.

FIG. 2B is a view showing only lower substrate 5 shown in FIG. 1. On substantially the entire surface of one principal surface of lower substrate 5, lower conductive layer 6 is formed. Lower electrode 7 is disposed along the outer circumference of long side 5L of lower substrate 5. In substantially the central portion of lower electrode 7, lead portion 7A is disposed.

One end of lower electrode 8 is disposed in the vicinity of end portion 5LT of long side 5L of lower substrate 5. Lower electrode 8 is disposed along the outer circumference of long side 5L and short side 5S and the other end thereof extends to substantially central portion 5LC of long side 5L. Furthermore, lower lead part 8A is coupled to the other end of lower electrode 8. Lower electrodes 7 and 8 are formed by removing a part of lower conductive layer 6 through etching or laser-cutting and then by printing a paste such as silver or carbon in the removed part.

In the vicinity of lead portions 7A and 8A, dummy lead parts 7B and 8B are provided. By providing dummy lead parts 7B and 8B, the thickness between upper substrate 1 and lower substrate 5 can be maintained to be substantially the same over substantially the entire surface when wiring board 20 is inserted to be held between upper substrate 1 and lower substrate 5 and then heating and pressing treatment is carried out. It is not preferable that without dummy lead parts 7B and 8B, convex and concave portions are generated on the touch panel and the thickness thereof may become ununiform.

Second Embodiment

Figure 3A:
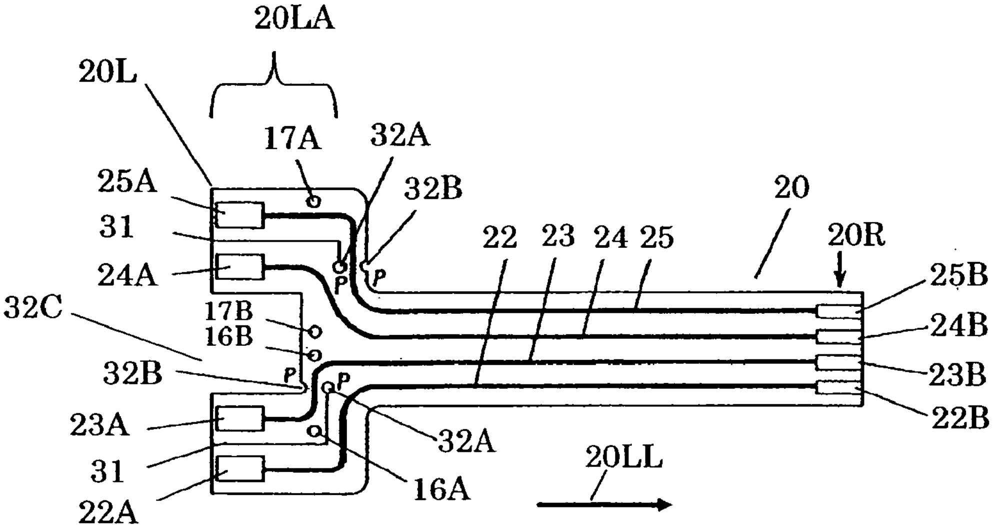
FIG. 3A is a plan view showing a wring board in accordance with a second embodiment of the present invention.

FIG. 3A shows a wiring board in accordance with a second embodiment of the present invention. Wiring board 20 in accordance with the second embodiment has a fork-shape. On one principal surface of wiring board 20, wiring patterns 22, 23, 24 and 25 are disposed. A plurality of electrodes 22B, 23B, 24B and 25B are coupled to one ends of wiring patterns 22 to 25, respectively.

Electrodes 22B to 25B are provided at the side of one end 20R of wiring board 20. To the other ends of wiring patterns 22 to 25, connectors 22A to 25A are coupled, respectively. Connectors 22A to 25A are provided at the side of other end 20L of wiring board 20. Connectors 22A to 25A are disposed together in connector disposed region 20LA having relatively large area.

Furthermore, concave portion 32C is provided in a part of connector disposed region 20LA. As shown in FIG. 3A, concave portion 32C is disposed in substantially the central portion of connector disposed region 20LA. Alternatively, concave portion 32C is disposed between one of connectors 22A to 25A and another connector neighboring the one connector. That is to say, concave portion 32C is disposed between connector 23A that is at least one of connectors 22A to 25A and connector 24A that is another connector neighboring connector 23A. In other words, concave portion 32C is disposed in a position dividing at least one connector of connectors 22A to 25A and the other connectors.

The area ratio of concave portion 32C occupying in the entire connector disposed region 20LA is relatively large and the ratio reaches, for example, from 10% to 50%. As mentioned below, concave portion 32C is a part of connectors 22A to 25A and is prepared as a region for accepting and containing a portion on which connectors are disposed when the connectors are bent. The size (area) and shape of concave portion 32C vary depending upon the shape and size of connectors 22A to 25A and the number of the connectors to be bent.

Cut portion 31 is provided in two portions, that is, between connector 22A and connector 23A and between connector 24A and connector 25A. Cut portion 31 extends from other end 20L of wiring board 20 toward hole 32A. Cut portion 31 is completely cut from one principal surface to the other principal surface of extremely fine wiring board 20 as cut by using, for example, an extremely fine edge tool. The long side of cut portion 31 is provided substantially in parallel to the longitudinal direction of wiring board 20.

Indentation 32B is provided at the side of end portion facing hole 32A of wiring board 20. A line linking between hole 32A and indentation 32B is prepared as flexible bending portion P-P. A part of cut portion 31 and indentation 32 communicate to bending portion P-P.

Furthermore, holes 16A, 16B, 17A, and 17B provided at predetermined positions can be used when, for example, wiring board 20 is subjected to some treatment or is moved to the next step, positioning is carried out.

Figure 3B:
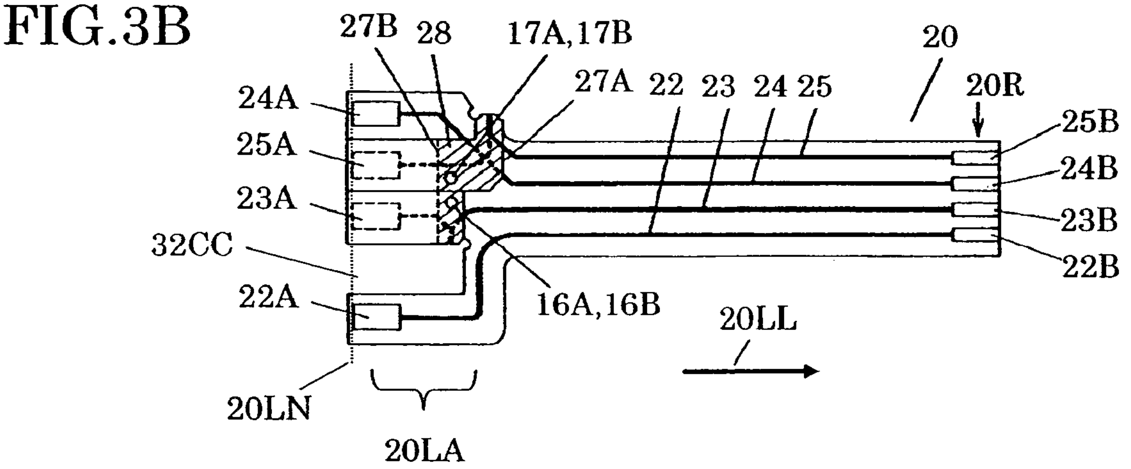
FIG. 3B is a plan view showing a wiring board, shown in FIG. 3A, bent along a bending portion.

FIG. 3B shows a state in which wiring board 20 is bent along bending portion P-P shown in FIG. 3A.

When wiring board 20 is bent, a bending jig (not shown) equipped with positioning pins on portions corresponding to holes 16A, 16B, 17A and 17B disposed on wiring board 20 is used, such that corresponding holes are positioned in the same positioning pins of this jig as shown in FIG. 3B.

That is to say, by bending wiring board 20 along bending portion P-P connected at the end of cut portion 31 provided between connectors 22A and 23A of wiring substrate 20 such that holes 16A and 16B are overlaid, connector 23A formed on the one principal surface of wiring board 20 is turned to be located at the side of the other principal surface. Furthermore, by bending wiring board 20 along bending portion P-P formed at the end of cut portion 31 provided between connectors 24A and 25A such that holes 17A and 17B are overlaid, connector 25A coupled to the one principal surface of wiring board 20 is turned to be located at the side of the other principal surface of wiring board 20.

As shown in FIG. 3B, when wiring board 20 is bent along bending portion P-P, concave portion 32C is closed by connectors 23A and 25A. However, a region where connector 23A was disposed before wiring board 20 is bent appears as new concave portion 32CC. Concave portion 32CC which is newly formed after bending or a part of concave portion 32C that has been present before bending increases the distance between one connector and a neighboring connector. Thus, electric insulating effect between both connectors can be enhanced. Furthermore, newly formed concave portion 32CC has a function of absorbing stress applied to wiring board 20. Furthermore, newly formed concave portion 32CC also functions as a mark indicating the position of connector disposed region 20LA.

Herein, connectors 22A and 24A are referred to as first connectors and connectors 23A and 25A are referred to as second connectors. First connectors (22A and 24A) remain the original positions even in the case where wiring board 20 is bent along bending portion P-P. That is to say, they are positioned at the side of the one principal surface of wiring board 20. On the contrary, second connectors (23A and 25A) are turned to be located at the side of the other principal surface of wiring board 20 when wiring board 20 is bent.

That is to say, when wiring board 20 is bent along bending portions P-P, connectors 23A and 25A are turned to change their positions. As a result, the order of the positions of the connectors is changed from 22A-23A-24A-25A before bending to 22A-23A-25A-24A after bending.

However, even after wiring board 20 is bent along bending portions P-P, a region in which connectors 22A, 23A, 25A and 24A are disposed is not doubled and remains a single layer substrate over the entire region. As a result, the thickness of wiring board 20 is kept to be the same as that of the original wiring board 20. Such a configuration is one of the significant features of the present invention.

The technical idea of the present invention disclosed in the first embodiment is summarized as follows. That is to say, a plurality of wiring patterns 22 to 25, electrodes 22B to 25B and connectors 22A to 25A are disposed at the side of one principal surface of wiring board 20. That is to say, these are disposed not on both surfaces of wiring board 20. Furthermore, connector disposed region 20LA on which connectors 22A to 25A are disposed together is provided at the side of one end 20L of the wiring board. Furthermore, connectors 22A to 25A include first connectors (connectors 22A and 24A) that remain the original portion and second connectors (connectors 23A and 25A) that change the positions when a part of wiring board 20 is bent. Furthermore, in connector disposed region 20LA, concave portion 32C having no member of wiring board 20 is formed. Concave portion 32C is prepared for accepting and containing connectors 23A and 25A of the second group when they are bent. Furthermore, in a part of connector disposed region 20LA, bending portions P-P and cut portions 31 are disposed. One bending portion P-P and one cut portion 31 are disposed between connector 22A that is one of the first connectors and connector 23A that is one of the second connectors or in the vicinity of these connectors.

Furthermore, bending portion P-P is disposed in parallel to or perpendicular to the longitudinal direction 20LL of wiring board 20.

In FIG. 3B, in order to fix the necessary portions which are in a bent state to each other, a region surrounded by line 27A and line 27B is used as adhering portion 28, and adhesive or an adhesive tape is applied to this portion.

As shown in FIG. 3B, connectors 22A to 25A after bending are aligned on line 20LN that is perpendicular to the longitudinal direction 20LL of wiring board 20.

Figure 4:
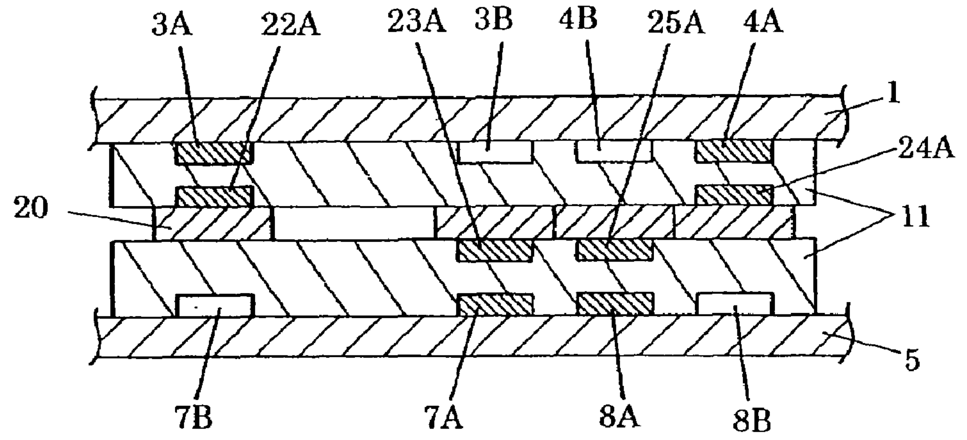
FIG. 4 is an enlarged sectional view showing an essential part of the touch panel shown in FIG. 1.

FIG. 4 is a sectional view showing a state in which wiring board 20 shown in FIG. 3B is bent and then incorporated into a touch panel. Wiring board 20 is disposed to be overlaid between upper substrate 1 and lower substrate 5. Since the thicknesses of connectors 22A and 24A that are not bent and the thicknesses of connectors 23A and 25A that were bent can be made to be the same, when the connectors are coupled to facing upper lead parts 3A and 4A and lower lead parts 7A and 8A by heating, pressing, and the like, uniform heating and pressing treatment can be carried out.

That is to say, upper lead parts 3A and 4A of upper substrate 1 are coupled to connectors 22A and 24A of wiring board 20 and lower lead parts 7A and 8A of lower substrate 5 are coupled to connectors 23A and 25A via anisotropic conductive agent 11. Thus, a touch panel is constructed.

Note here that FIG. 4A shows a state in which connectors 22A and 24A are coupled to the side of upper substrate 1 and connectors 23A and 25A are coupled to the side of lower substrate 5, respectively. However, coupling may be carried out in an opposite manner. That is to say, connectors 22A and 24A may be coupled to the side of lower substrate 5 and connectors 23A and 25A may be coupled to the side of upper substrate 1, respectively.

Touch panel 100 constructed in this way is mounted on a front surface of a display device such as an LCD, and each one of the wiring patterns of wiring board 20 is coupled via coupling connector (not shown) to a detecting circuit of an electronic apparatus.

When upper substrate 1 that is an operation surface of touch panel 100 is depressed with a finger, a pen, or the like, upper substrate 1 is bowed, and upper conductive layer 2 corresponding to the depressed portion of upper substrate 1 is brought into contact with lower conductive layer 6. Then, the detecting circuit (not shown) applies voltage to a portion between upper electrodes 3 and 4 via connectors 22A and 24A as well as a portion between lower electrodes 7 and 8 via connectors 23A and 25A, thereby detecting a location of the depressed portion from the ratio of resistance components between electrodes and switching a function of the electronic apparatus to another function.

Resistance component Rx at the side of upper electrodes 3 and 4 on the upper surface is detected at connectors 22A and 24A on the upper surface and sent to a detecting circuit by electrodes 22B and 24B by way of wiring patterns 22 and 24 which extend as it is.

On the other hand, resistance component Ry at the side of lower electrodes 7 and 8 on the lower surface is detected at connectors 23A and 25A on the lower surface and sent to a detecting circuit by electrodes 23B and 25B by way of wiring patterns 23 and 25 which extend as it is.

That is to say, it is necessary to couple the connectors of the corresponding wiring board 20 between the upper and lower electrodes which are facing each other, which is realized by the wiring patterns on only one surface.

Thus, according to the first embodiment, since wiring patterns and through holes necessary to change the arrangement of the connectors (in the example mentioned above, 23A and 25A) are not necessary to be formed, inexpensive wiring board 20 can be obtained.

Furthermore, since bending can be carried out only by inserting a plurality of holes 16A, 16B, 17A and 17B into predetermined positioning pins, it is possible to manufacture an input device more easily as compared with the case where these holes are not used.

The input device is constructed so that a plurality of connectors 22A to 25A on wiring board 20 are coupled to their corresponding lead portions 3A, 4A, 7A and 8A. As a result, wiring patterns on both surfaces of wiring board 20 and through-holes are not needed, which makes it possible to achieve inexpensive input devices and a method of manufacturing the input device.

In the foregoing description, an optically transparent touch panel includes upper and lower substrates 1 and 5 as well as upper and lower conductive layers 2 and 6 made from indium tin oxide, tin oxide, or the like which are formed on the entire surfaces of upper and lower substrates 1 and 5. In stead of the this configuration, however, the present invention can be made by printing upper and lower conductive layers 2 and 6 with paste such as silver or carbon that is not transparent like upper electrodes 3 and 4 and lower electrodes 7 and 8.

Furthermore, an upper conductive layer is formed on a predetermined portion of upper substrate 1, and a lower conductive layer is formed on a predetermined portion of the upper surface of lower substrate 5. The lower conductive layer faces the upper conductive layer with predetermined space sandwiched between the lower conductive layer and the upper conductive layer. By depressing the side of the upper surface of upper substrate 1, only the predetermined places of the upper conductive layer and lower conductive layer are brought into electrical contact with each other. This construction allows forming an input device such as a membrane switch.

In the foregoing description, wiring board 20 shown in FIG. 3A in which the positions of connectors are aligned was described as an example. An example in which the positions of the connectors are not aligned is described as an example.

Third Embodiment

Figure 5A:
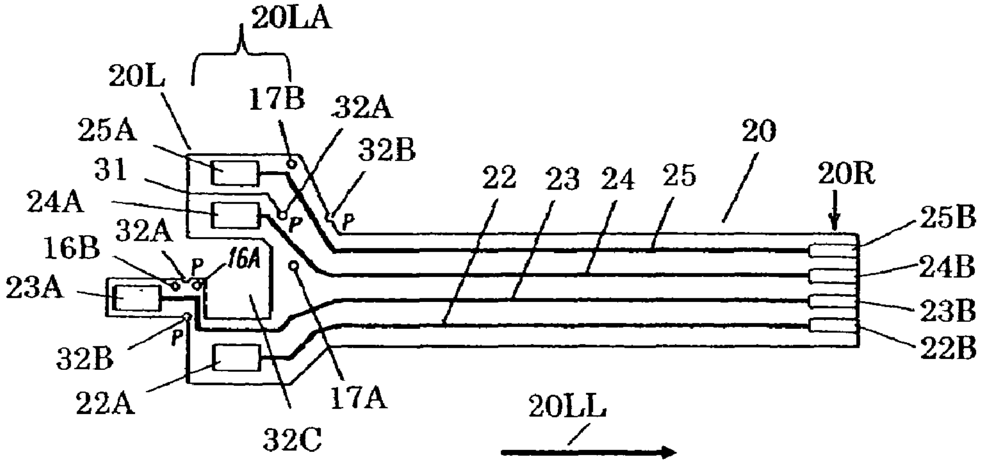
FIG. 5A is a plan view showing a wiring board in accordance with a third embodiment of the present invention.

FIG. 5A shows wiring board 20 in accordance with a third embodiment. Wiring board 20 has a little deformed fork-shape. On one principal surface of wiring board 20, as described in the second embodiment, wiring patterns 22, 23, 24 and 25 are disposed. To one ends of wiring patterns 22 to 25, a plurality of electrodes 22B, 23B, 24B and 25B are coupled, respectively.

Electrode 22B to 25B are provided at the side of one end 20R of wiring board 20. To the other ends of wiring patterns 22 to 25, connectors 22A to 25A are coupled, respectively. Connectors 22A to 25A are provided at the side of the other end 20L of wiring board 20. Connectors 22A to 25A are disposed together in connector disposed region 20LA having relatively large area.

Furthermore, concave portion 32C is provided in a part of connector disposed region 20LA. As shown in FIG. 5A, concave portion 32C is disposed in substantially the central portion of connector disposed region 20LA. Alternatively, concave portion 32C may be disposed between one of connectors 22A to 25A and an other connector neighboring the one connector. That is to say, concave portion 32C is disposed between connector 22A that is one of connectors 22A to 25A and connector 24A that is an other connector neighboring the one connector. In other words, concave portion 32C is disposed in a position dividing at least one connector of a plurality of connectors 22A to 25A and the other connectors. Furthermore, the area ratio of concave portion 32C occupying in the entire connector disposed region 20LA is relatively large and the ratio reaches, for example, from 10% to 50%. Concave portion 32C is prepared as a region for accepting and containing the bent portion when a part of the connectors 22A to 25A are bent. The size (area) and shape of concave portion 32C vary depending upon the shape and size of connectors 22A to 25A and the number of connectors to be bent.

Cut portion 31 is provided in a portion between connector 24A and connector 25A. Cut portion 31 extends from other end 20L of wiring board 20 toward hole 32A. In the second embodiment, cut portion 31 is provided in two places but in the third embodiment, cut portion 31 is provided in one place. Cut portion 31 is completely cut from one principal surface to the other principal surface of extremely thin wiring board 20 as cut by using, for example, an extremely fine edge tool.

Indentation 32B is provided in a part facing hole 32A of wiring board 20. A line linking hole 32A and indentation 32B is prepared as flexible bending portion P-P. Bending portion P-P is provided in two places. Bending portion P-P disposed in the vicinity of connector 24A is provided substantially in parallel to the longitudinal direction 20LL of wiring board 20. Furthermore, bending portion P-P disposed in the vicinity of connector 23A is provided substantially perpendicular to the longitudinal direction 20LL of wiring board 20. That is to say, in the third embodiment, two bending portions P-P are disposed in the direction in which they are perpendicular to each other. Thus, in the third embodiment, the bending directions are different from each other.

Furthermore, holes 16A, 16B, 17A, and 17B provided at predetermined positions can be used when, for example, wiring board 20 is subjected to some treatment or is moved to the next step, positioning is carried out.

Figure 5B:
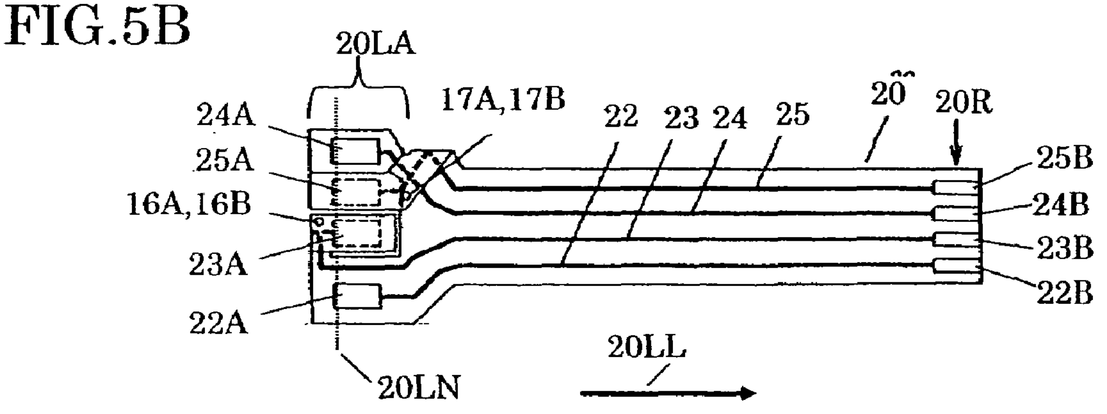
FIG. 5B is a plan view showing a wiring board, shown in FIG. 5A, bent along a bending portion.

FIG. 5B is a plan view showing a state in which a wiring board shown in FIG. 5A is bent along bending portions. When wiring board 20 is bent, a bending jig (not shown) equipped with positioning pins on portions corresponding to holes 16A, 16B, 17A and 17B disposed on wiring board 20 is used, such that corresponding holes are positioned in the same positioning pins of this jig as shown in FIG. 5B.

That is to say, by bending wiring board 20 along bending portion P-P connected at the end of cut portion 31 provided between connectors 24A and 25A of wiring substrate 20 such that holes 16A and 16B are overlaid, connector 23A formed on the one principal surface of wiring board 20 is turned to be located at the side of the other principal surface. Furthermore, by bending wiring board 20 along bending portion P-P formed at the end of cut portion 31 provided between connectors 24A and 25A such that holes 17A and 17B are overlaid, connector 25A coupled to the one principal surface of wiring board 20 is turned to be located at the side of the other principal surface of wiring board 20.

Herein, connectors 22A and 24A are referred to as first connectors and connectors 23A and 25A are referred to as second connectors. First connectors (22A and 24A) remain the original positions even in the case where wring board 20 is bent at bending portion P-P. That is to say, they are positioned at the side of the one principal surface of wiring board 20. On the contrary, second connectors (23A and 25A) are turned to be located at the side of the other principal surface of wiring board 20 when wiring board 20 is bent.

That is to say, when wiring board 20 is bent along bending portions P-P, connectors 23A and 25A are turned to change their positions. As a result, the order of the positions of the connectors is changed from 22A-23A-24A-25A before bending to 22A-23A-25A-24A after bending.

However, connectors 22A, 23A, 25A and 24A after wiring board 20 is bent along the bending portion P-P are formed so as to be in a state of a single layer and to have the same thickness as that before wiring board 20 is bent.

Also in the third embodiment, as shown in FIG. 5B, all of connectors 22A to 25A after bending are aligned on line 20LN that is perpendicular to the longitudinal direction 20LL of wiring board 20.

Note here that when second connectors 23A and 25A are bent, almost entire region of concave portion 32C is closed by second connectors 23A and 25A. However, a part of concave portion 32C may appear instead of completely closing concave portion 32C. Furthermore, instead of bending two connectors, that is, connectors 23A and 25A, only one connector, for example, connector 23A may be bent. In such a case, even after only connector 23A is bent, about a half of concave portion 32C appear as it is. However, this configuration is also acceptable. Moreover, after at least one of connectors 22A to 25A is bent, when a part of concave portion 32C is allowed to remain, space between the connectors is generated, thereby enabling the electrical insulation property to be enhanced.

In the third embodiment, while the arrangement of electrodes 22B to 25B on wiring board 20 is maintained, resistance component Rx at the side of the upper electrode can be sent to a detecting circuit by electrodes 22B and 24B and resistance component Ry at the side of the lower electrode can be sent to a detecting circuit by electrodes 23B and 25B.

Thus, in accordance with the third embodiment, the positions of the connectors can be aligned after bending, so that they are incorporated into a touch panel easily. As a result, wiring patterns on both surfaces of wiring board and through-holes are not needed in order to change the arrangement of a plurality of connectors 22A to 25A, which makes it possible to achieve inexpensive input devices.

Fourth Embodiment

A fourth embodiment shows an example in which wiring board 20 is bent only in the direction perpendicular to wiring board 20.

Figure 6A:
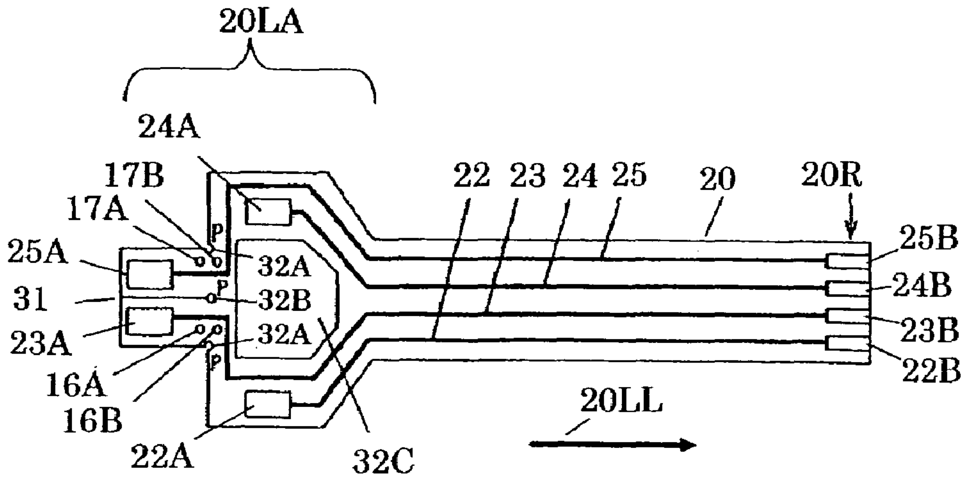
FIG. 6A is a plan view showing a wiring board in accordance with a fourth embodiment of the present invention.

FIG. 6A relates to the fourth embodiment of the present invention. On one principal surface of wiring board 20 in accordance with the fourth embodiment, similar to the second and third embodiments, wiring patterns 22, 23, 24 and 25 are disposed. To one end of wiring patterns 22 to 25, a plurality of electrodes 22B, 23B, 24B and 25B are coupled, respectively.

Electrodes 22B to 25B are provided at the side of one end 20R of wiring board 20. To other ends of wiring patterns 22 to 25, connectors 22A to 25A are coupled, respectively. Connectors 22A to 25A are provided at the side of the other end 20L of wiring board 20. Connectors 22A to 25A are disposed together in connector disposed region 20LA having relatively large area.

Furthermore, concave portion 32C is provided in a part of connector disposed region 20LA. As shown in FIG. 6A, concave portion 32C is disposed in substantially the central portion of connector disposed region 20LA. Alternatively, concave portion 32C is disposed between one of connectors 22A to 25A and an other connector neighboring the one connector. That is to say, concave portion 32C is disposed between connector 22A that is at least one of connectors 22A to 25A and connector 24A that is one of the other connectors neighboring connector 22A. In other words, concave portion 32C is disposed in a position dividing at least one connector of a plurality of connectors 22A to 25A and the other connectors.

Furthermore, the area ratio of concave portion 32C occupying in the entire connector disposed region 20LA is relatively large and the ratio reaches, for example, from 10% to 50%. Concave portion 32C is prepared as a region for containing the bent portion when a part of connectors 22A to 25A is bent. The size (area) and shape of concave portion 32C vary depending upon the shape and size of connectors 22A to 25A and the number of the connectors to be bent.

Furthermore, between connectors 23A and 25A, cut portion 31 extending from the other end portion 20L toward hole 32A in wiring board 20 is provided in one position. Cut portion 31 is completely cut from one principal surface of extremely thin wiring board 20 to the other principal surface as cut by using, for example, an extremely fine edge tool.

Indentation 32B is provided in the side of end portion facing hole 32A of wiring board 20. A line linking hole 32A and indentation 32B is prepared as flexible bending portion P-P.

Furthermore, holes 16A, 16B, 17A, and 17B provided at predetermined positions can be used when, for example, wiring board 20 is subjected to some treatment or is moved to the next step, positioning is carried out.

Figure 6B:
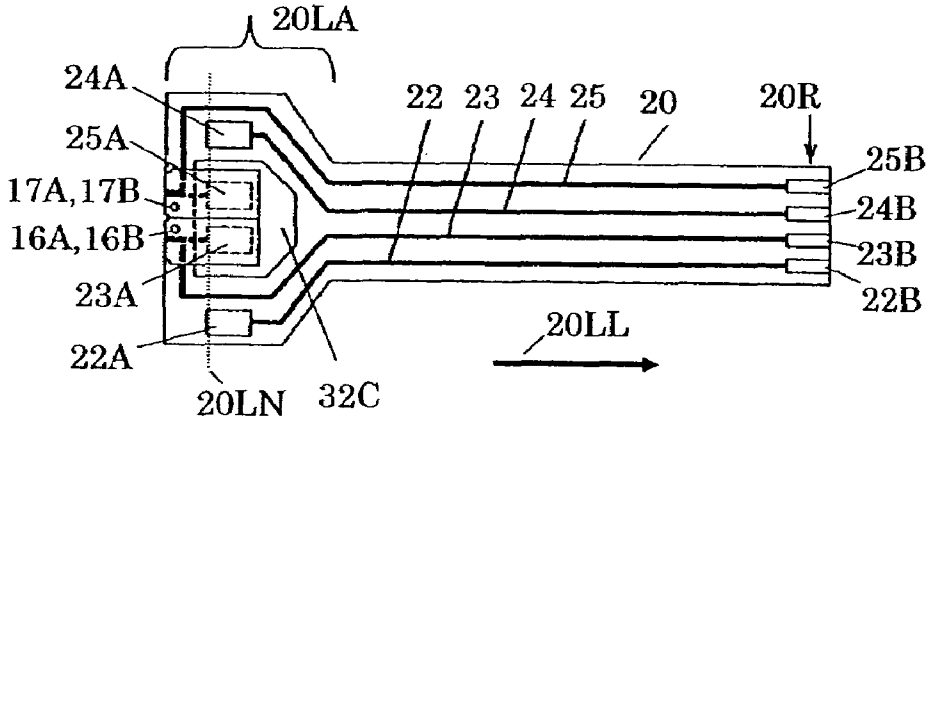
FIG. 6B is a plan view showing a wiring board, shown in FIG. 6A, bent along a bending portion.
Figure 7:
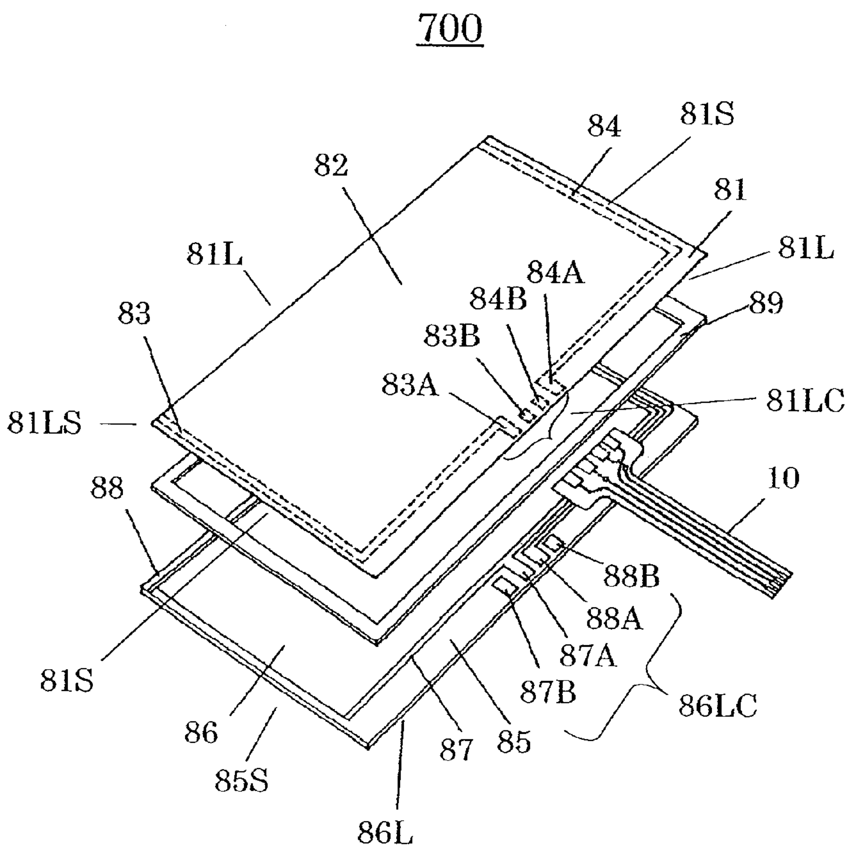
FIG. 7 is an exploded perspective view showing a conventional optically transparent touch panel.
Figure 8:
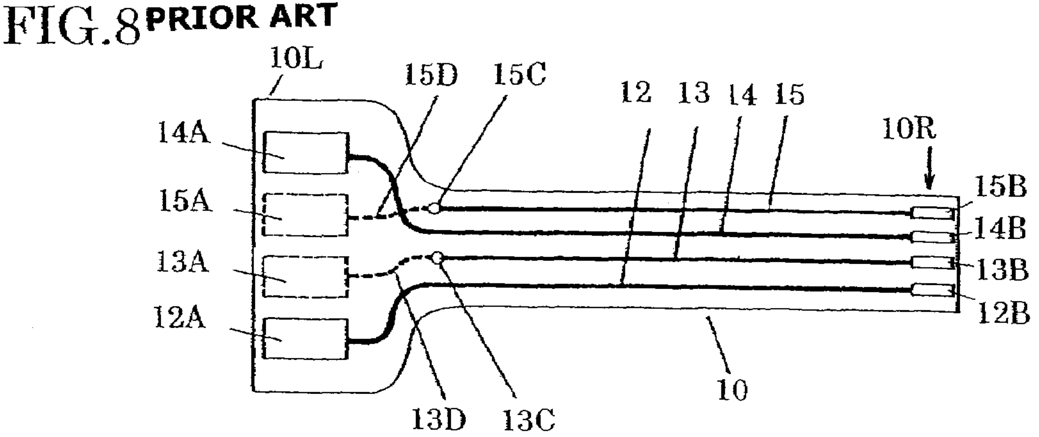
FIG. 8 is a plan view showing a wiring board of the conventional optically transparent touch panel shown in FIG. 7.
Figure 9:
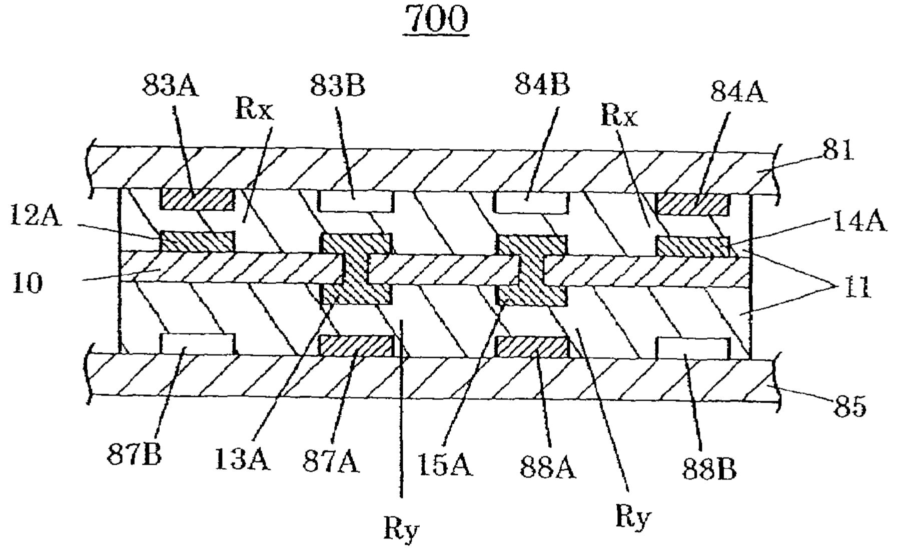
FIG. 9 is an enlarged sectional view showing an essential part of the conventional optically transparent touch panel shown in FIG. 7.

FIG. 6B shows a state in which wiring board 20 shown in FIG. 6A is bent along bending portion P-P and cut portion 31. A part of bending portion P-P communicates to cut portion 31.

When wiring board 20 is bent, a bending jig (not shown) equipped with positioning pins on portions corresponding to holes 16A, 16B, 17A and 17B disposed on wiring board 20 is used, such that corresponding holes are positioned in the same positioning pins of this jig as shown in FIG. 6B.

That is to say, by bending wiring board 20 along cut portion 31 provided between connectors 23A and 25A and bending portion P-P such that holes 16A and 16B are overlaid, connectors 23A and 25A formed on one principal surface of wiring board 20 are disposed at the side of the other principal surface of wiring board 20.

Herein, connectors 22A and 24A are referred to as first connectors and connectors 23A and 25A are referred to as second connectors. Even in the case where the connectors are bent at bending portion P-P, first connectors (22A and 24A) remain the original positions. That is to say, they are positioned at the side of the one principal surface of wiring board 20. On the contrary, second connectors (23A and 25A) are turned to be located at the side of the other principal surface of wiring board 20.

Also in the fourth embodiment, as shown in FIG. 6B, all of connectors 22A to 25A after bending are aligned on line 20LN that is perpendicular to the longitudinal direction 20LL of wiring board 20.

The fourth embodiment shows wiring board 20 in which the connectors are bent in the direction perpendicular to the longitudinal direction 20LL of wiring board 20, and in which a part of concave portion 32C appears even after at least one of the plurality of connectors is bent. However, almost entire region of concave portion 32C may be closed.

In any case, also in the fourth embodiment, connectors 22A, 23A, 25A and 24A, after bending along the bending portion P-P, are formed so as to be in a state of a single layer and have the same thickness over the entire region, which is a feature of the invention of the present application.

INDUSTRIAL APPLICABILITY

A wiring board, an input device using the wiring board, and a method of manufacturing the input device of the present invention has advantages in simplifying a construction in which the arrangement of the connectors of the wiring board is changed, allowing all the connectors on the wiring board to be constructed to have the same thickness, and allowing the connectors to deal flexibly with relative positional variations due to thermal expansion or moisture-absorption expansion of an upper substrate and an lower substrate. As a result, the present invention can provide a cheap wiring board capable of enhancing the reliability of electrical and mechanical connections between these connectors and other lead portions, an input device using the wiring board and a method of manufacturing the input device. The present invention is thus useful for an input device such as an optically transparent touch panel to be used for operating a variety of electronic apparatuses, and a method of manufacturing the input device.

The invention claimed is:

1. A wiring board comprising:

first and second electrodes provided on one principal surface of the wiring board;

first and second connection patterns coupled respectively to the first and second electrodes at one end;

first and second connectors coupled to an other end of the first and second connection patterns;

a connector disposed region in which the first and second connectors are disposed;

a concave portion provided in the connector disposed region and initially having no member of the wiring board therein, a portion of the wiring board being bent so as to form a bending portion between the connector disposed region and at least one electrode of the first and second electrodes.

2. The wiring board of claim 1, wherein a cut portion is disposed between the first connector and the second connector.

3. The wiring board of claim 2, wherein the cut portion communicates to at least a part of the bending portion.

4. The wiring board of claim 1, wherein the cut portion communicates to at least a part of the bending portion.

5. The wiring board of claim 1, wherein the bending portion is disposed in parallel to or perpendicular to a longitudinal direction of the wiring board.

6. The wiring board of claim 1, wherein the concave portion is disposed in substantially a central portion of the connector disposed region.

7. The wiring board of claim 1, wherein the concave portion is disposed between at least one of the connectors and at least one of other connectors.

8. The wiring board of claim 1, wherein when any one of the first connector and the second connector is bent along the bending portion, the bent connector is contained in the concave portion.

9. The wiring board of claim 1, wherein a part of the bending portion communicates to an indentation provided on a part of the wiring board.

10. The wiring board of claim 1, wherein when any one of the first connector and the second connector is bent along the bending portion, a line linking between the first and second connectors is disposed on the same line that is perpendicular to a longitudinal direction of the wiring board.

11. An input device comprising:

a wiring board including: first and second electrodes provided on one principal surface of the wiring board; first and second connection patterns coupled respectively to the first and second electrodes at one end; first and second connectors coupled to an other end of the first and second connection patterns; a connector disposed region in which the first and second connectors are disposed; a concave portion provided in the connector disposed region and initially having no member of the wiring board therein, a portion of the wiring board being bent so as to form a bending portion between the connector disposed region and at least one electrode of the first and second electrodes;

an upper substrate including an upper conductive layer provided on an entire surface or a part of one principal surface and an upper electrode coupled to the upper conductive layer; and a lower substrate including a lower conductive layer, provided on an entire surface or a part of one principal surface, facing the upper conductive layer with predetermined space between the upper and lower conductive layers and a lower electrode coupled to this lower conductive layer;

wherein the first or second connector of the wiring board is coupled to any one of the upper electrode of the upper substrate and the lower electrode of the lower substrate.

12. A method of manufacturing the input device according to claim 11, the method comprising:

coupling the first and second connectors to predetermined portions of the upper electrode and the lower electrode of the upper and lower substrates which are facing each other after the wiring board is bent.

* * * * *